US011587871B2

(12) United States Patent
Suzuki et al.

(10) Patent No.: US 11,587,871 B2
(45) Date of Patent: Feb. 21, 2023

(54) SEMICONDUCTOR DEVICE AND METHOD OF MANUFACTURING SAME

(71) Applicant: Kioxia Corporation, Tokyo (JP)

(72) Inventors: Kazutaka Suzuki, Kuwana (JP);
Kazuhiro Nakanishi, Yokkaichi (JP);
Kazuhiro Nojima, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 76 days.

(21) Appl. No.: 17/116,158

(22) Filed: Dec. 9, 2020

(65) Prior Publication Data

US 2021/0091001 A1 Mar. 25, 2021

Related U.S. Application Data

(63) Continuation of application No. PCT/JP2018/031321, filed on Aug. 24, 2018.

(51) Int. Cl.
*H01L 23/528* (2006.01)
*H01L 23/522* (2006.01)
(Continued)

(52) U.S. Cl.
CPC ...... *H01L 23/5283* (2013.01); *H01L 23/5226* (2013.01); *H01L 24/08* (2013.01);
(Continued)

(58) Field of Classification Search
CPC ............... H01L 23/5226; H01L 23/481; H01L 23/5283; H01L 24/05; H01L 24/08;
(Continued)

(56) References Cited

U.S. PATENT DOCUMENTS 6,600,225 B2    7/2003  Tanaka
7,229,921 B2    6/2007  Hironaga et al.
(Continued)

FOREIGN PATENT DOCUMENTS

JP      06-084908 A     3/1994
JP      09-283617 A    10/1997
(Continued)

OTHER PUBLICATIONS

International Search Report dated Nov. 27, 2018 in PCT/JP2018/031321 filed on Aug. 24, 2018, citing documents AB, AD-AE & AM-AQ therein, 2 pages.

*Primary Examiner* — Jaehwan Oh
*Assistant Examiner* — John M Parker
(74) *Attorney, Agent, or Firm* — Oblon, McClelland, Maier & Neustadt, L.L.P.

(57) ABSTRACT

In one embodiment, a semiconductor device includes a first insulator, a plurality of interconnections provided in the first insulator. The device further includes a second insulator provided on the first insulator and the plurality of interconnections, and a conductor provided on a first interconnection among the plurality of interconnections and having a shape that is projected upwardly with respect to the first interconnection in the second insulator. The device further includes a plug provided on the first interconnection via the conductor. The device further includes a first pad provided above the plug and electrically connected to the plug, and a second pad provided on the first pad and electrically connected to the first pad.

8 Claims, 15 Drawing Sheets

(51) Int. Cl.
*H01L 23/00* (2006.01)
*H01L 27/11556* (2017.01)
*H01L 27/11582* (2017.01)

(52) U.S. Cl.
CPC ........ *H01L 24/80* (2013.01); *H01L 27/11556* (2013.01); *H01L 27/11582* (2013.01); *H01L 2224/08145* (2013.01); *H01L 2224/80895* (2013.01)

(58) Field of Classification Search
CPC ................ H01L 24/80; H01L 25/0657; H01L 27/11556; H01L 27/11582; H01L 2224/08145; H01L 2224/80895
See application file for complete search history.

(56) References Cited

U.S. PATENT DOCUMENTS

| | | | |
|---|---|---|---|
| 8,476,708 | B2* | 7/2013 | Fukuzumi ......... H01L 27/11582 257/326 |
| 9,558,945 | B2 | 1/2017 | Fukuzumi et al. |
| 10,217,670 | B2 | 2/2019 | Tapily et al. |
| 10,622,407 | B1* | 4/2020 | Huang ................... H01L 43/02 |
| 2002/0185736 | A1 | 12/2002 | Tanaka |
| 2004/0245623 | A1* | 12/2004 | Hara ..................... H01L 23/481 257/737 |
| 2009/0146313 | A1* | 6/2009 | Terazono ............ H01L 23/5286 257/774 |
| 2010/0238331 | A1* | 9/2010 | Umebayashi ....... H01L 27/1464 257/E31.097 |
| 2013/0099098 | A1* | 4/2013 | Kobayashi ........ H01L 27/14632 250/208.1 |
| 2013/0154112 | A1* | 6/2013 | Zhang ............... H01L 23/49827 438/455 |
| 2014/0015084 | A1* | 1/2014 | Chen .................... H01L 27/1464 257/E31.127 |
| 2016/0079164 | A1 | 3/2016 | Fukuzumi et al. |
| 2016/0083675 | A1 | 3/2016 | Morita et al. |
| 2016/0111371 | A1* | 4/2016 | Peng ................. H01L 21/76807 438/653 |
| 2016/0233264 | A1* | 8/2016 | Kagawa ........... H01L 27/14634 |
| 2017/0062324 | A1 | 3/2017 | Brown et al. |
| 2018/0068899 | A1 | 3/2018 | Tapily et al. |
| 2020/0203272 | A1* | 6/2020 | Doebler ............ H01L 23/53257 |

FOREIGN PATENT DOCUMENTS

| | | |
|---|---|---|
| JP | 11-074345 A | 3/1999 |
| JP | 2002-368085 A | 12/2002 |
| JP | 2010-129686 A | 6/2010 |
| JP | 2012-060035 A | 3/2012 |
| JP | 2016-062901 A | 4/2016 |
| JP | 6203525 B2 | 9/2017 |
| JP | 2018-041963 A | 3/2018 |
| TW | 564514 B | 12/2003 |

* cited by examiner

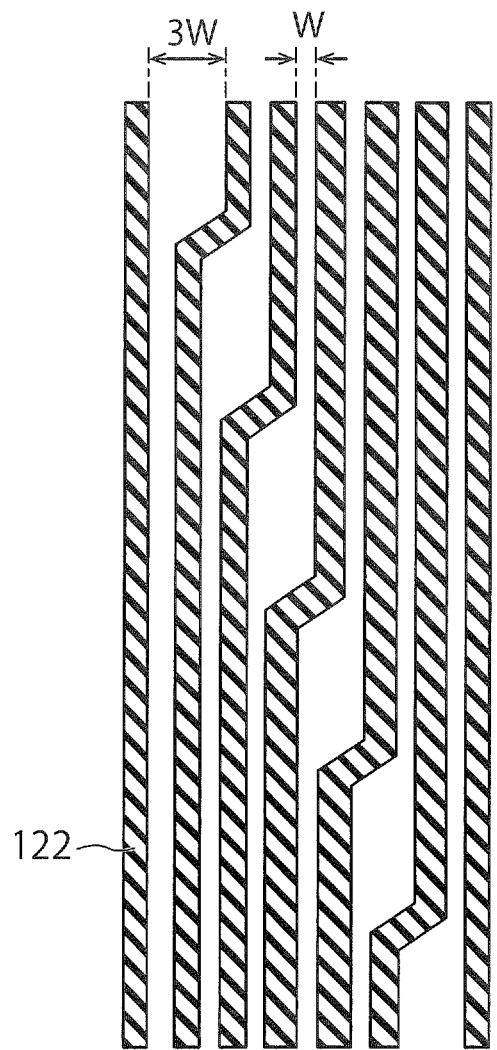
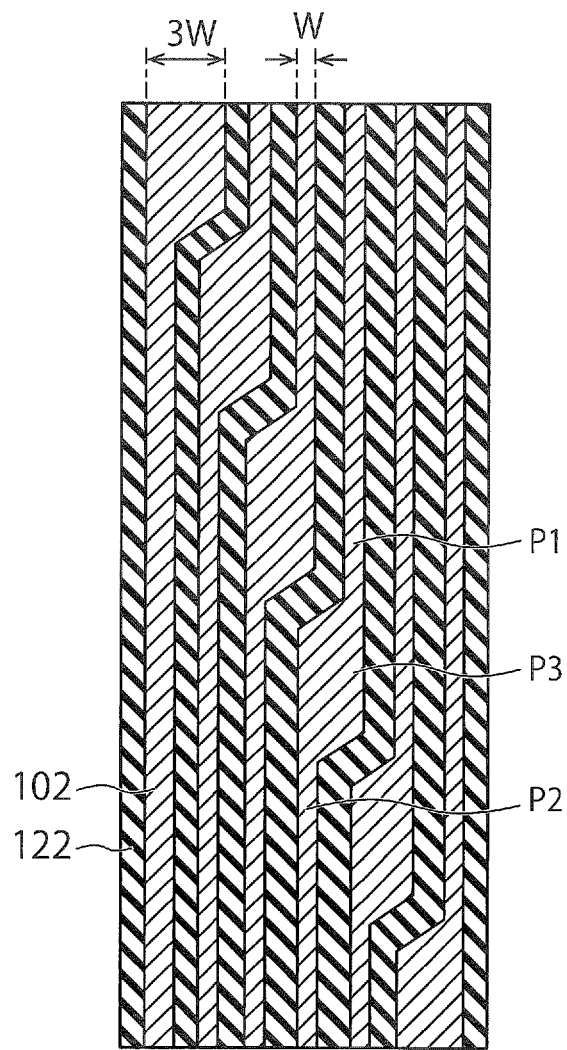
FIG. 15A
FIG. 15B

SEMICONDUCTOR DEVICE AND METHOD OF MANUFACTURING SAME

CROSS REFERENCE TO RELATED APPLICATION

This application is based upon and claims the benefit of priority from the prior International Patent Application No. PCT/JP2018/031321, filed on Aug. 24, 2018, the entire contents of which are incorporated herein by reference.

FIELD

Embodiments described herein relate to a semiconductor device and a method of manufacturing same.

BACKGROUND

To achieve high integration, semiconductor devices such as three-dimensional memories that are each formed of layered memory cells have been developed. With the progress of such layering, some of the three-dimensional memories are manufactured by joining metal pads on a wafer and metal pads on another wafer by a bonding process. In such semiconductor devices, interconnections may be thinned to further improve the integration, or a plug may be formed on a thin interconnection to be connected to an upper-layer interconnection to shorten the interconnection length. In such a case, there are problems that positioning a plug and a corresponding interconnection is difficult, and a short between the plug and another interconnection easily occurs. The same problems may occur in a case where a plug is formed on an interconnection in semiconductor devices other than the three-dimensional memories.

BRIEF DESCRIPTION OF THE DRAWINGS

FIGS. 14A to 15B are plan views showing a method of manufacturing the semiconductor device of the second embodiment.

DETAILED DESCRIPTION

Figure 1:
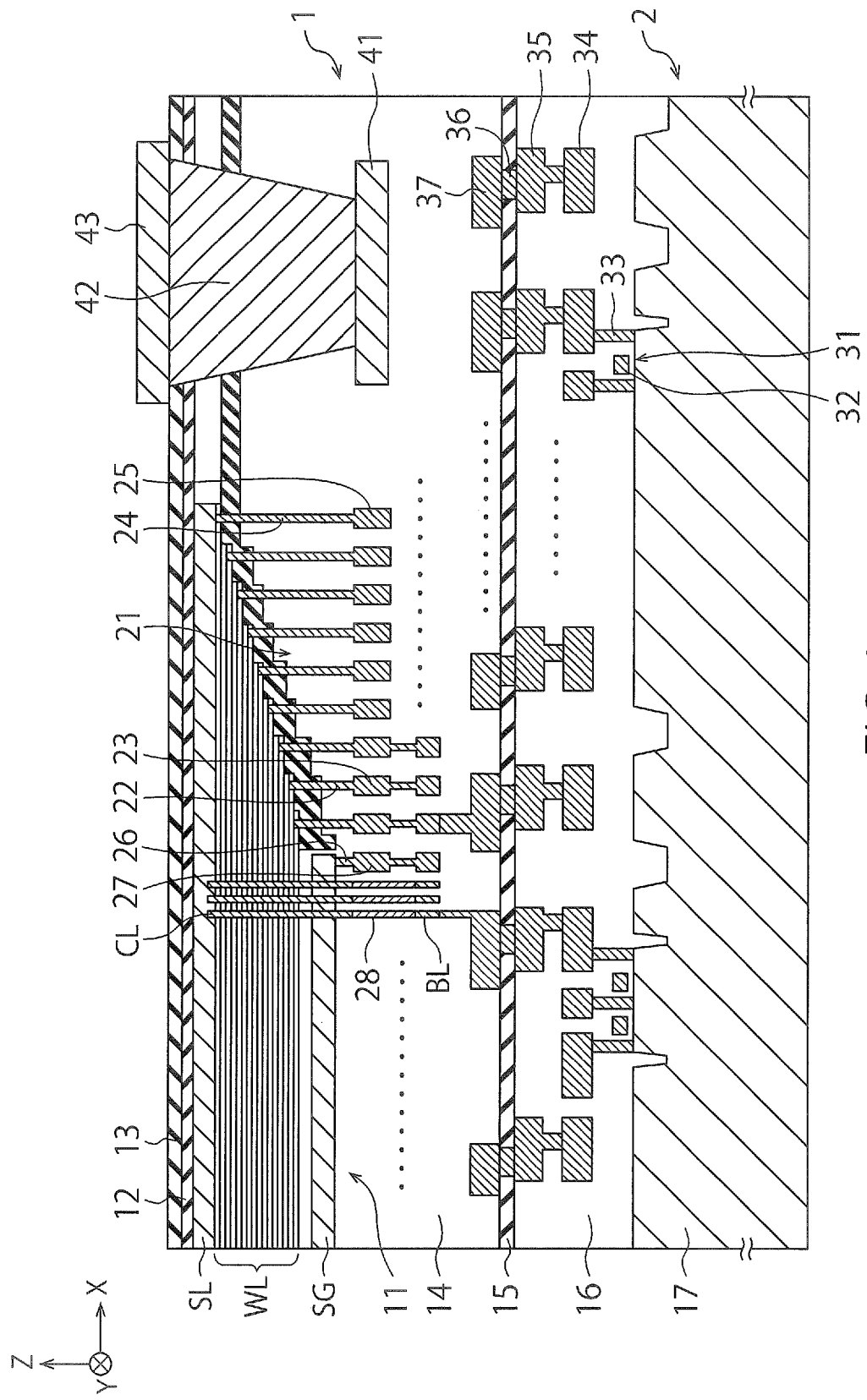
FIG. 1 is a cross-sectional view showing the structure of a semiconductor device of a first embodiment.

In one embodiment, a semiconductor device includes a first insulator, a plurality of interconnections provided in the first insulator. The device further includes a second insulator provided on the first insulator and the plurality of interconnections, and a conductor provided on a first interconnection among the plurality of interconnections and having a shape that is projected upwardly with respect to the first interconnection in the second insulator. The device further includes a plug provided on the first interconnection via the conductor. The device further includes a first pad provided above the plug and electrically connected to the plug, and a second pad provided on the first pad and electrically connected to the first pad.

Embodiments will now be explained with reference to the accompanying drawings. Throughout FIGS. 1 to 15B, an identical or similar component is denoted by the same reference numeral, and an overlapping explanation thereof is omitted.

First Embodiment

FIG. 1 is a cross-sectional view showing the structure of a semiconductor device of a first embodiment. The semiconductor device in FIG. 1 is a three-dimensional memory in which an array chip 1 and a circuit chip 2 are joined together.

The array chip 1 includes a memory cell array 11 including a plurality of memory cells, an insulating layer 12 (e.g., silicon nitride layer) disposed on the memory cell array 11, an insulating layer 13 (e.g., silicon oxide layer) disposed on the insulating layer 12, and an inter layer dielectric 14 disposed under the memory cell array 11.

The circuit chip 2 is disposed below the array chip 1 via an insulating layer 15. The circuit chip 2 includes an inter layer dielectric 16 and a substrate 17 disposed under the inter layer dielectric 16. For example, the substrate 17 is a semiconductor substrate such as a silicon substrate. In FIG. 1, an X direction and a Y direction that are parallel to a surface of the substrate 17 and are perpendicular to each other, and a Z direction that is perpendicular to the surface of the substrate 17 are shown. The +Z direction and the -Z direction herein are regarded as an upward direction and a downward direction, respectively. However, the -Z direction may match the gravity direction but does not need to match the gravity direction.

The array chip 1 includes a plurality of word lines WL, a source line SL, and a selection gate SG, as electrode layers in the memory cell array 11. FIG. 1 illustrates a stepped structure 21 in the memory cell array 11. As illustrated in FIG. 1, the word lines WL are electrically connected to word interconnection layers 23 via contact plugs 22, the source line SL is electrically connected to a source interconnection layer 25 via a contact plug 24, and the selection gate SG is electrically connected to a selection gate interconnection layer 27 via a contact plug 26. A columnar portion CL passing through the word lines WL, the source line SL, and the selection gate SG is electrically connected to a bit line BL via a plug 28.

The circuit chip 2 includes a plurality of transistors 31. The transistors 31 each include a gate electrode 32 that is disposed on the substrate 17 via a gate insulator, and a source diffusion layer and a drain diffusion layer (not illustrated) that are disposed in the substrate 17. The circuit chip 2 further includes a plurality of plugs 33 that are disposed on the source diffusion layers or drain diffusion layers of the transistors 31, interconnection layer 34 that include a plurality of interconnections and that are disposed on the plugs 33, and interconnection layers 35 that include a plurality of interconnections and that are disposed on the interconnection layers 34. A plurality of metal pads 36 disposed in the insulating layer 15 are disposed on the interconnection layers 35. The array chip 1 includes interconnection layers 37 that are disposed on the metal pads 36 and that include a plurality of interconnections. The word lines WL and the bit lines BL of the present embodiment are electrically connected to the corresponding interconnection layers 37.

The array chip 1 further includes a pad 41 that is electrically connected to the interconnection layers 37 via a via plug (not illustrated), an external connection electrode 42 that is disposed on the pad 41, and an external connection pad 43 that is disposed on the external connection electrode 42. The external connection pad 43 can be connected to a mounting substrate or another device via a solder ball, a metal bump, a bonding wire, or the like.

Figure 2:
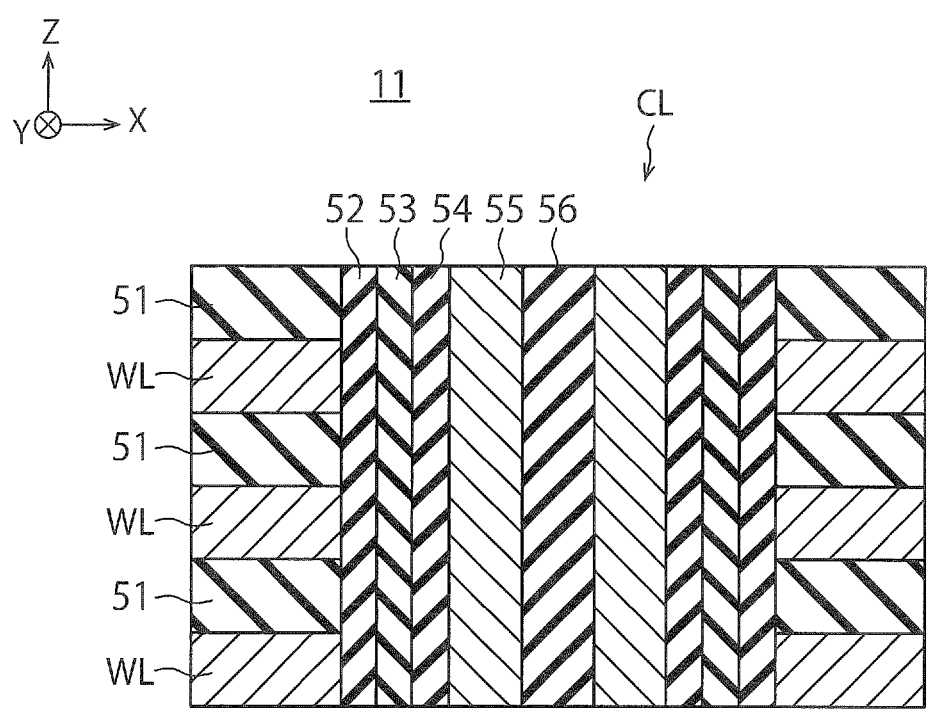
FIG. 2 is a cross-sectional view showing the structure of a columnar portion of the first embodiment.

FIG. 2 is a cross-sectional view showing the structure of the columnar portion CL of the first embodiment.

As illustrated in FIG. 2, the memory cell array 11 includes a plurality of the word lines WL and a plurality of insulating layers 51 that are alternately layered on the inter layer dielectric 14. The word lines WL are W (tungsten) layers, for example. The insulating layers 51 are silicon oxide layers, for example.

The columnar portion CL includes a block insulator 52, a charge storage layer 53, a tunnel insulator 54, a channel semiconductor layer 55, and a core insulator 56. The charge storage layer 53 is a silicon nitride layer, for example, and is formed on a side face of the word lines WL and the insulating layers 51 via the block insulator 52. The channel semiconductor layer 55 is a silicon layer, for example, and is formed on a side face of the charge storage layer 53 via the tunnel insulator 54. The block insulator 52, the tunnel insulator 54, and the core insulator 56 are silicon oxide layers or metal insulating layers, for example.

Figure 3:
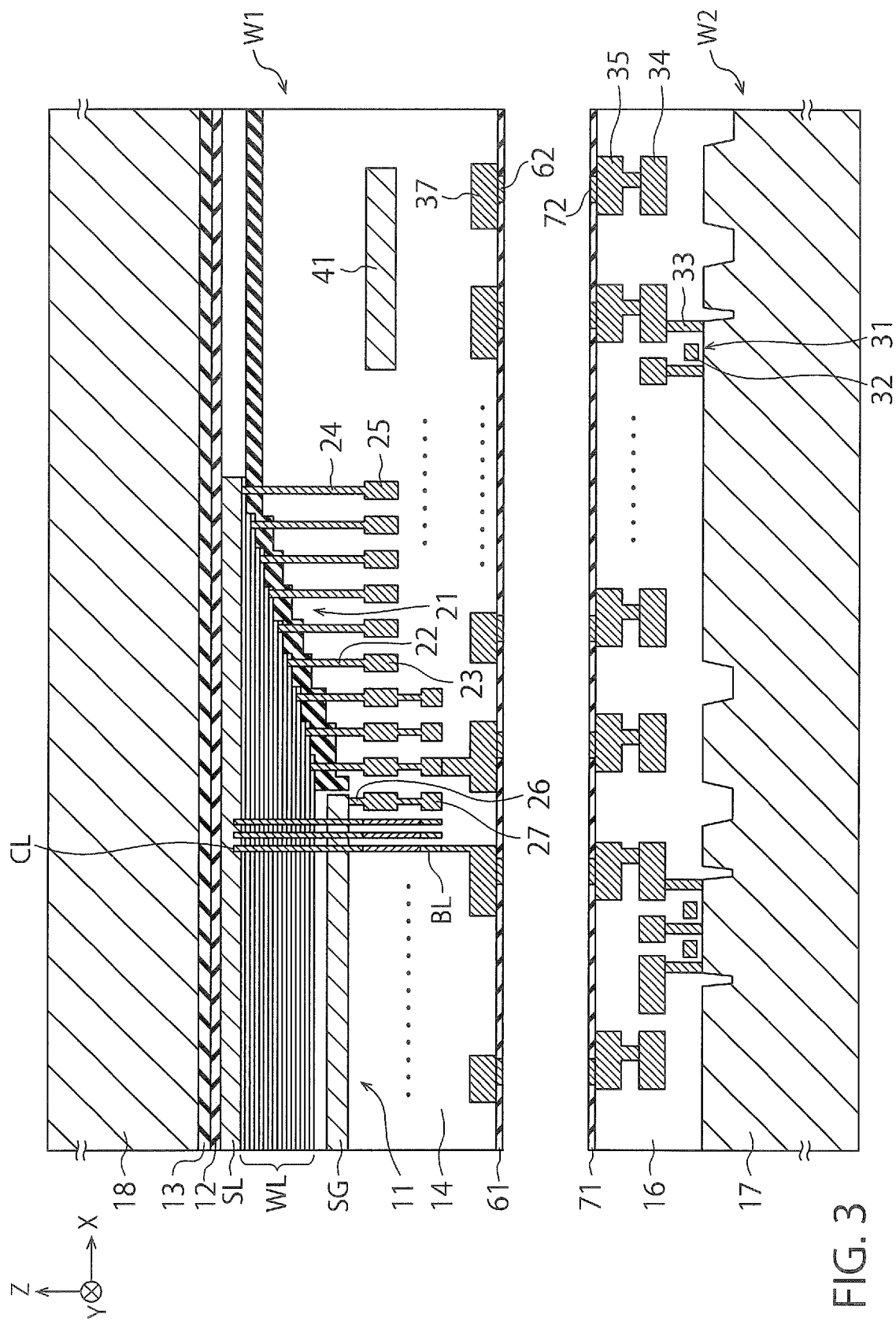
FIG. 3 is a cross-sectional view showing a method of manufacturing the semiconductor device of the first embodiment.

FIG. 3 is a cross-sectional view showing a method of manufacturing the semiconductor device of the first embodiment.

FIG. 3 illustrates an array wafer W1 including a plurality of the array chips 1, and a circuit wafer W2 including a plurality of the circuit chips 2. FIG. 3 further illustrates a first insulating layer 61 and a plurality of first metal pads 62 that are disposed on the lower face of the array wafer W1, and a second insulating layer 71 and a plurality of second metal pads 72 that are disposed on the upper face of the circuit wafer W2. The first metal pads 62 are disposed on the lower faces of the interconnection layers 37. The second metal pads 72 are disposed on the upper faces of the interconnection layers 35. In addition, the array wafer W1 includes a substrate 18 on the insulating layer 13.

The first insulating layer 61 is formed on the lower face of the inter layer dielectric 14 in FIG. 3, but the first insulating layer 61 may be integrally included in the inter layer dielectric 14. Similarly, the second insulating layer 71 is formed on the upper face of the inter layer dielectric 16 in FIG. 3, but the second insulating layer 71 may be integrally included in the inter layer dielectric 16.

First, the array wafer W1 and the circuit wafer W2 are bonded under a mechanical pressure. As a result, the first insulating layer 61 and the second insulating layer 71 are adhered to each other so that the insulating layer 15 is formed. Next, the array wafer W1 and the circuit wafer W2 are annealed at 400° C. As a result, the first metal pads 62 and the second metal pads 72 are joined so that a plurality of the metal pads 36 are formed.

Subsequently, the substrate 18 is removed by CMP (Chemical Mechanical Polishing) or wet etching, and the array wafer W1 and the circuit wafer W2 are cut into a plurality of chips. In the aforementioned manner, the semiconductor device in FIG. 1 is manufactured. The external connection electrode 42 and the external connection pad 43 are formed on the pad 41 after the substrate 18 is removed, for example.

In the present embodiment, the array wafer W1 and the circuit wafer W2 are joined together. Alternatively, the array wafers W1 may be joined together. The above explanation which has been given with reference to FIGS. 1 to 3, and an explanation which will be given later with reference to FIGS. 4 to 15B are also applicable to a case in which the array wafers W1 are joined together. The array wafer W1 is also called a memory wafer, and the circuit wafer W2 is also called a CMOS wafer.

Figure 4:
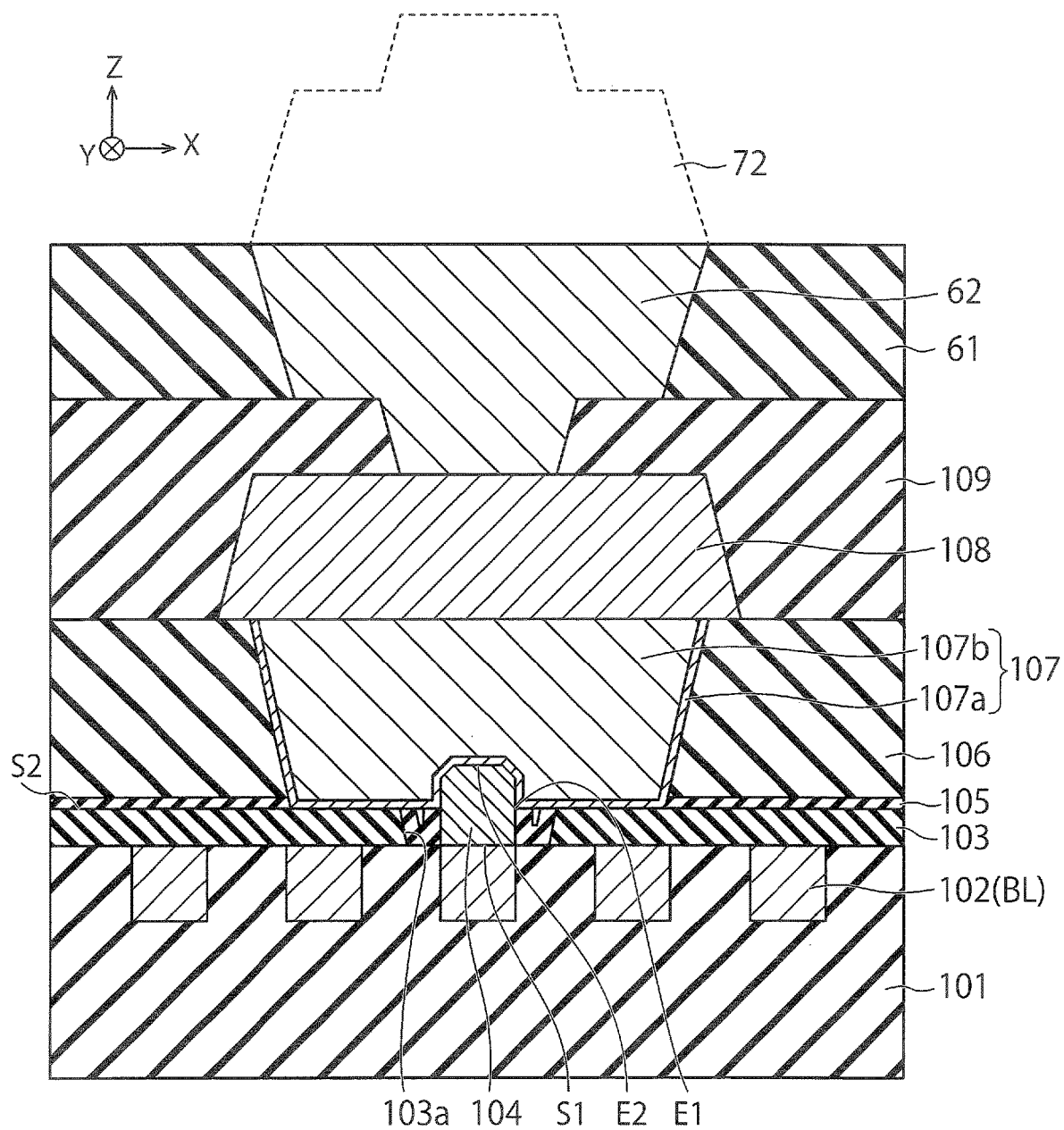
FIG. 4 is a cross-sectional view showing the structure of an array chip of the first embodiment.

FIG. 4 is a cross-sectional view showing the structure of the array chip 1 of the first embodiment. However, it is to be noted that the upward direction and the downward direction in FIG. 4 are opposite to those in FIG. 1. FIG. 4 illustrates a state in which the array chip 1 illustrated in FIG. 1 is turned upside down. The same applies to FIGS. 5A to 15B.

As illustrated in FIG. 4, the array chip 1 includes a first inter layer dielectric 101 which is one example of a first insulator, a plurality of metal interconnections 102, a stopper insulator 103 which is one example of a second insulator, a metal bump 104 which is one example of a conductor, a spacer insulator 105, a second inter layer dielectric 106, a via plug 107, a metal interconnection 108, and a third inter layer dielectric 109. FIG. 4 further illustrates a first insulating layer 61 and a first metal pad 62 in the array chip 1, and a second metal pad 72 in the circuit chip 2.

The first inter layer dielectric 101 is an $SiO_2$ layer (silicon oxide layer), for example, and constitutes the aforementioned inter layer dielectric 14 together with the second inter layer dielectric 106 and the third inter layer dielectric 109. The metal interconnection 102 is a Cu (copper) interconnection, for example, and is formed in the first inter layer dielectric 101. The metal interconnection 102 of the present embodiment is the aforementioned bit line BL.

The stopper insulator 103 is an SiN layer (silicon nitride layer), for example, and is formed on the first inter layer dielectric 101 and the metal interconnections 102. Reference character 103a denotes an opening formed above one metal interconnection 102 among the metal interconnections 102. Hereinafter, the one metal interconnection 102 is referred to as "first metal interconnection 102". Reference character S1 denotes the upper face of the first metal interconnection 102. Reference character S2 denotes the upper face of the stopper insulator 103.

The metal bump 104 is made from Cu, CoWPB, CoWB, or Sn (Co, B, P, and Sn represent cobalt, boron, phosphorus, and tin, respectively), for example, and is formed in the opening 103a of the stopper insulator 103. Specifically, the metal bump 104 is formed on the first metal interconnection 102, and has a shape that is projected upwardly with respect to the first metal interconnection 102. A plan shape of the metal bump 104 is a circle, a square, a nearly circular shape, or a nearly square shape, for example. The metal bump 104 of the present embodiment is formed on the first metal interconnection 102 by plating. Reference character E2 denotes the upper end (highest portion) of the metal bump 104.

The spacer insulator 105 is a plasma SiN layer, for example, and is formed, on the upper face S2 of the stopper insulator 103 and in the opening 103a of the stopper insulator 103, between the stopper insulator 103 and the metal bump 104. The second inter layer dielectric 106 is an SiO$_2$ layer, for example, and is formed on the spacer insulator 105.

In the second inter layer dielectric 106, the via plug 107 is formed on the stopper insulator 103, the metal bump 104, and the spacer insulator 105, and is formed above the first metal interconnection 102 via the metal bump 104. The via plug 107 includes a barrier metal layer 107a that is formed on surfaces of the stopper insulator 103, the metal bump 104, and the spacer insulator 105, and a plug material layer 107b that is formed on the surfaces via the barrier metal layer 107a. The barrier metal layer 107a is a conductive layer containing Ti (titanium) or Ta (tantalum), for example. The plug material layer 107b is a W (tungsten) layer, for example. Like the plan shape of the metal bump 104, the plan shape of the via plug 107 is a circle, a square, a nearly circular shape, or a nearly square shape, for example. However, the area of the upper face of the via plug 107 is set to be larger than the area of the lower face of the metal bump 104. Reference character E1 denotes the lower end (lowest portion) of a contact face between the metal bump 104 and the via plug 107.

The metal interconnection 108 is formed on the via plug 107. The third inter layer dielectric 109 is formed on the second inter layer dielectric 106 so as to cover the metal interconnection 108. The first insulating layer 61 is formed on the third inter layer dielectric 109.

The first metal pad 62 in the first insulating layer 61 is formed on the metal interconnection 108, is positioned above the via plug 107, and is electrically connected to the via plug 107 via the metal interconnection 108. In FIG. 4, the area of the upper face of the first metal pad 62 of the present embodiment is illustrated to be substantially equal to the area of the upper face of the via plug 107 for easy understanding. However, the area of the upper face of the first metal pad 62 is set to be two times or more (e.g. ten times or more) larger than the area of the upper face of the via plug 107.

The second metal pad 72 in the second insulating layer 71 is formed on the first metal pad 62, and is electrically connected to the first metal pad 62. The area of the lower face of the second metal pad 72 of the present embodiment is substantially equal to the area of the upper face of the first metal pad 62.

As explained so far, the via plug 107 of the present embodiment is formed above the first metal interconnection 102 via the metal bump 104. Therefore, a contact face between the via plug 107 and an interconnection disposed therebelow is located to be higher than the upper face S1 of the first metal interconnection 102. Specifically, the lower end E1 of the contact face between the metal bump 104 and the via plug 107 is set at a position higher than the upper face S1 of the first metal interconnection 102.

Accordingly, the distance between the via plug 107 for the first metal interconnection 102 and the metal interconnections 102 excluding the first metal interconnection 102 can be made long in the up-down direction, whereby a short therebetween and aging deterioration of the stopper insulator 103 can be inhibited. According to the present embodiment, this distance is made long in the up-down direction even in a case where the metal interconnections 102 are thin or a case where the distance between the metal interconnections 102 is narrow. Accordingly, the aforementioned short and aging deterioration can be effectively inhibited. Moreover, according to the present embodiment, even when the positioning accuracy in lithography for the via plug 107 is low, the aforementioned short can be easily inhibited so that the lithography cost can be reduced.

The metal bump 104 may be housed in the opening 103a. However, it is desirable that the metal bump 104 is upwardly protruded from the opening 103a. Therefore, in the present embodiment, the upper end E2 of the metal bump 104 is set at a position higher than the upper face S2 of the stopper insulator 103, and the lower end E1 of the contact face between the metal bump 104 and the via plug 107 is set at a position lower than the upper end E2 of the metal bump 104. Consequently, a wider short margin between the via plug 107 for the first metal interconnection 102 and the metal interconnections 102 excluding the first metal interconnection 102 can be ensured.

The metal interconnections 102 of the present embodiment are the bit lines BL, and are disposed near the columnar portion CL, for example. In a region near the columnar portion CL, it is general that the bit lines BL are thin and the distance between the bit lines BL is narrow. However, according to the present embodiment, the via plug 107 can be formed on a metal interconnection 102 that is thin. Therefore, the via plug 107 can be formed on a metal interconnection 102 near the columnar portion CL. This results in reduction of the interconnection lengths of the metal interconnections 102. The reason for this is that the metal interconnection 102 does not need to be extended to a point distant from the columnar portion CL so as to allow the via plug 107 to be formed on that point. Consequently, the integration of the semiconductor device can be further improved, and electrostatic capacitance between the metal interconnections 102 can be reduced. Further, in the present embodiment, the first metal pad 62 is disposed directly above (+Z direction) the via plug 107, whereby the interconnection length between the first metal pad 62 and the via plug 107 can be shortened, and the integration of the semiconductor device can be further improved.

FIGS. 5A to 8B are cross-sectional views showing a method of manufacturing the array wafer W1 of the first embodiment.

Figure 5A:
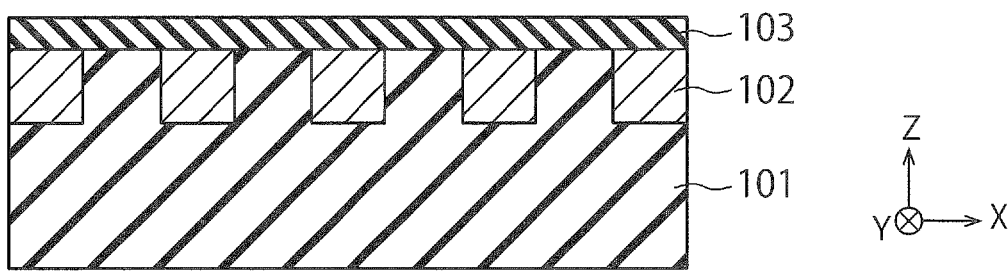
FIGS. 5A to 8B are cross-sectional views showing a method of manufacturing an array wafer of the first embodiment.

First, a plurality of the metal interconnections 102 are formed in the first inter layer dielectric 101, and the stopper insulator 103 is formed on the first inter layer dielectric 101 and the metal interconnections 102 (FIG. 5A). The thickness of the stopper insulator 103 is 20 to 30 nm, for example.

Figure 5B:
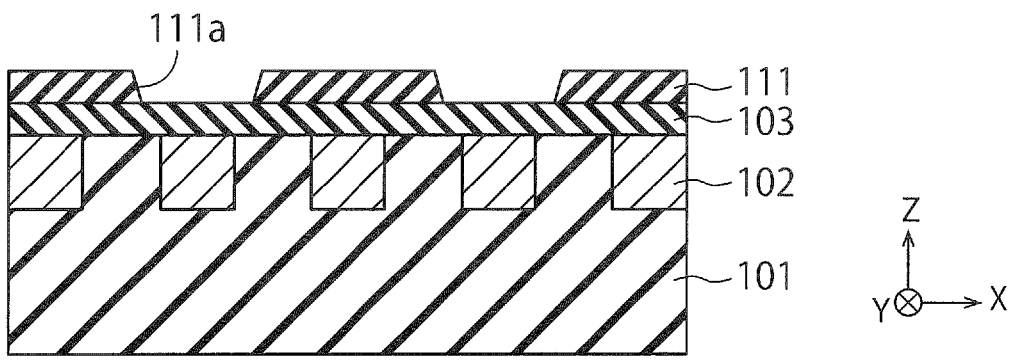
Figure 5C:
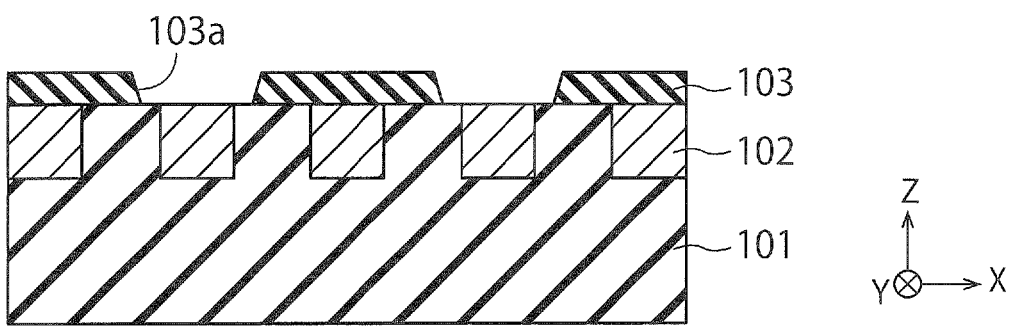

Next, a resistor 111 is formed on the stopper insulator 103, and an opening 111a is formed in the resistor 111 by lithography and etching (FIG. 5B). Next, the stopper insulator 103 in the opening 111a is removed by etching, whereby an opening 103a is formed in the stopper insulator 103 (FIG. 5C). Thereafter, the resistor 111 is removed.

Figure 6A:
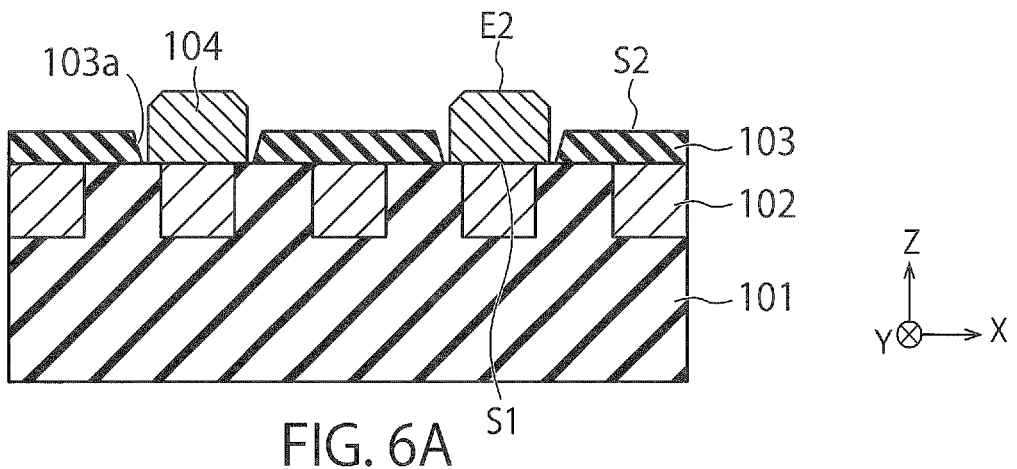

Next, the metal bump 104 is formed on the metal interconnection 102 that is exposed to the inner side of the opening 103a in the stopper insulator 103 (FIG. 6A). The metal bump 104 of the present embodiment is formed on the metal interconnection 102 by electroless plating. As a result, the metal bump 104 grows so as to have a shape that is projected upwardly with respect to the metal interconnections 102. In FIG. 6A, the upper end E2 of the metal bump 104 is located at a position higher the upper face S2 of the stopper insulator 103. Two metal interconnections 102 disposed under the two metal bumps 104 in FIG. 6A correspond to the first metal interconnections 102.

Since the metal bump 104 of the present embodiment is formed by plating, the metal bump 104 can be formed on the metal interconnection 102 in a self-alignment manner even in a case where the opening 103a is formed at a position slightly deviated from the metal interconnection 102. Each of the metal bumps 104 may be selectively formed only on the upper face of the metal interconnection 102, or may be formed, in the opening 103a, on the entire upper face of the first inter layer dielectric 101 and the metal interconnection 102.

Figure 6B:
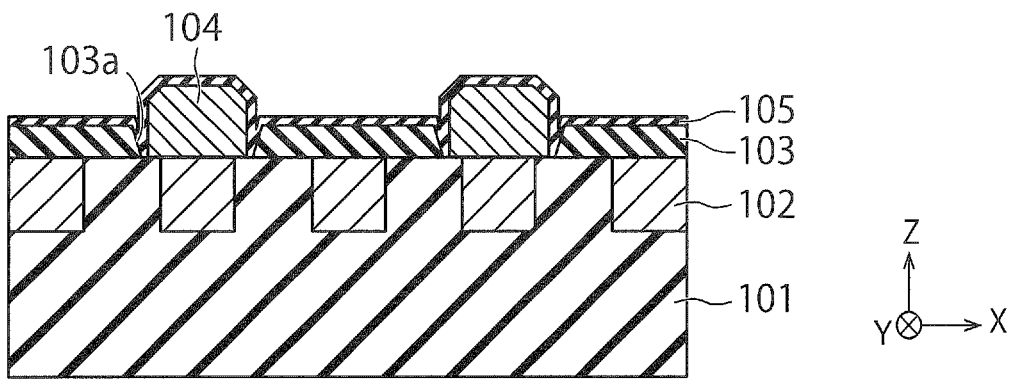

Next, the spacer insulator 105 is formed on the entire substrate 18 (not illustrated) (FIG. 6B). As a result, the spacer insulator 105 is formed on the first inter layer dielectric 101, the stopper insulator 103, and the surface of the metal bumps 104, and in the gap, in the opening 103a, between the stopper insulator 103 and the metal bump 104. In a case where such a gap does not exist or is filled with another layer before the spacer insulator 105 is formed, the spacer insulator 105 does not need to be formed. The thickness of the spacer insulator 105 is 2 to 3 nm, for example.

Figure 6C:
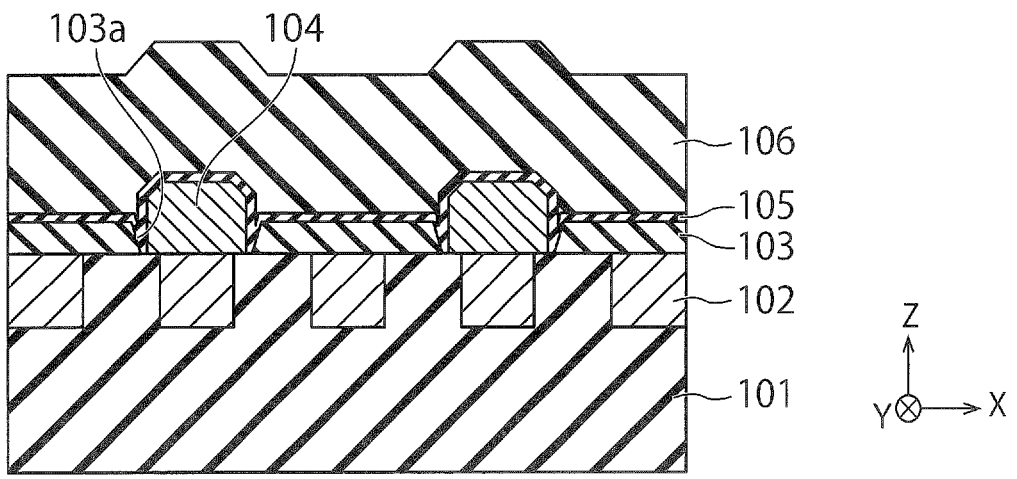
Figure 7A:
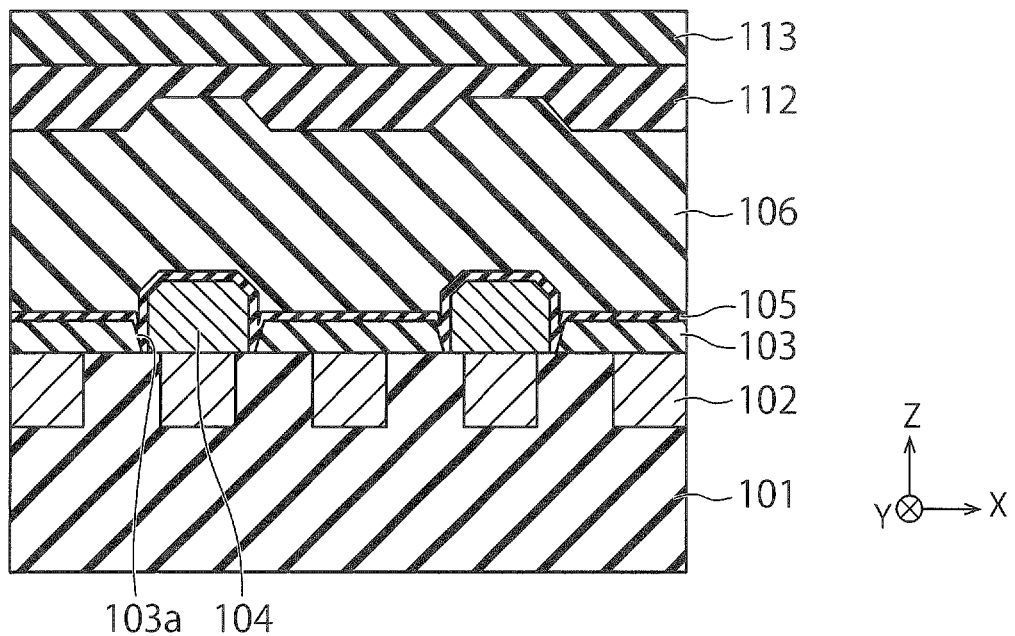

Next, the second inter layer dielectric 106 is formed on the spacer insulator 105 (FIG. 6C). Next, a base layer 112 and a resistor 113 are formed in order on the second inter layer dielectric 106 (FIG. 7A). For example, the base layer 112 is an organic layer, an antireflection layer (e.g., $SiO_2$ layer), or a laminate layer including the organic layer and the antireflection layer.

Figure 7B:
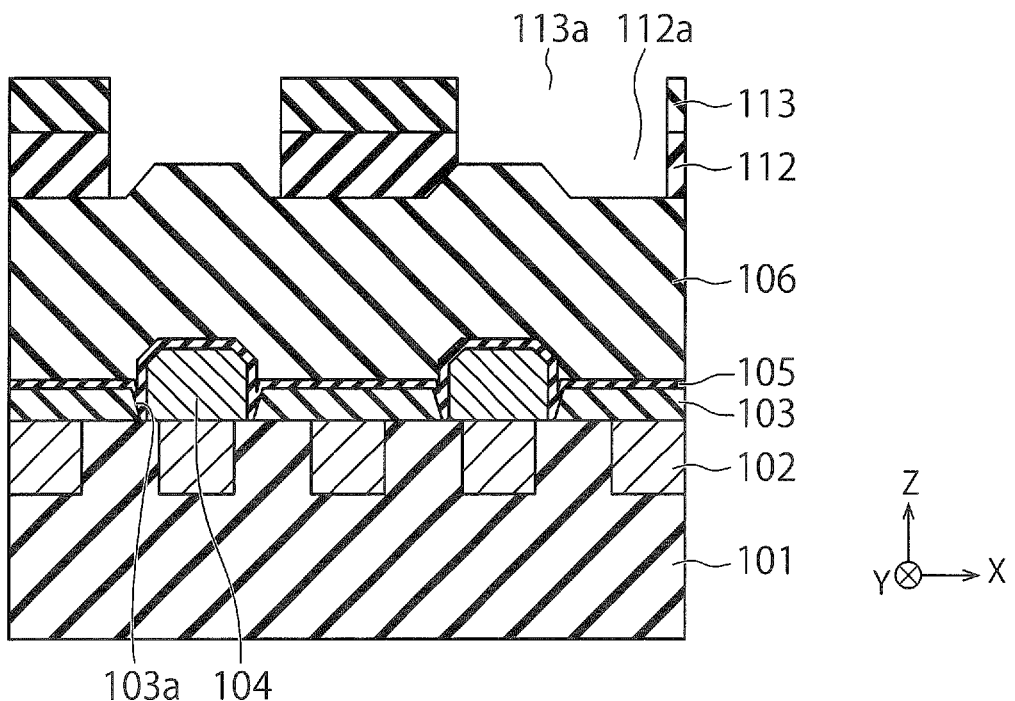

Next, an opening 113a is formed in the resistor 113 by lithography and etching (FIG. 7B). Next, the base layer 112 in the opening 113a is removed by etching so that an opening 112a is formed in the base layer 112 (FIG. 7B).

Figure 8A:
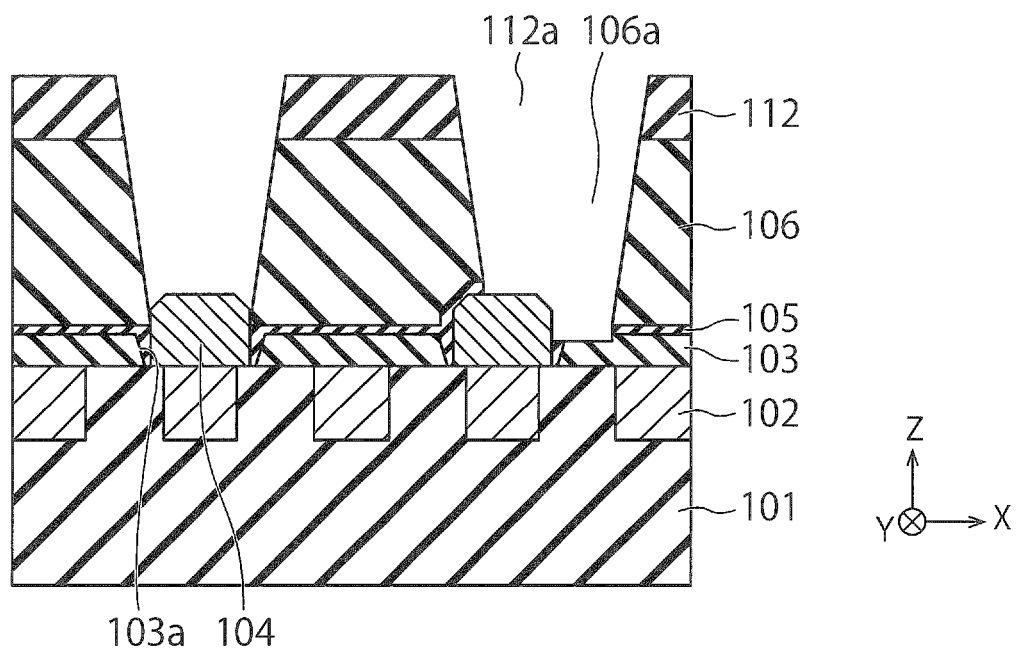

Next, the second inter layer dielectric 106 in the opening 112a is removed by etching so that an opening 106a is formed in the second inter layer dielectric 106 (FIG. 8A). Further, the spacer insulator 105 in the opening 106a is removed (FIG. 8A). As a result, the metal bump 104 is exposed to the inside of the opening 106a.

Figure 8B:
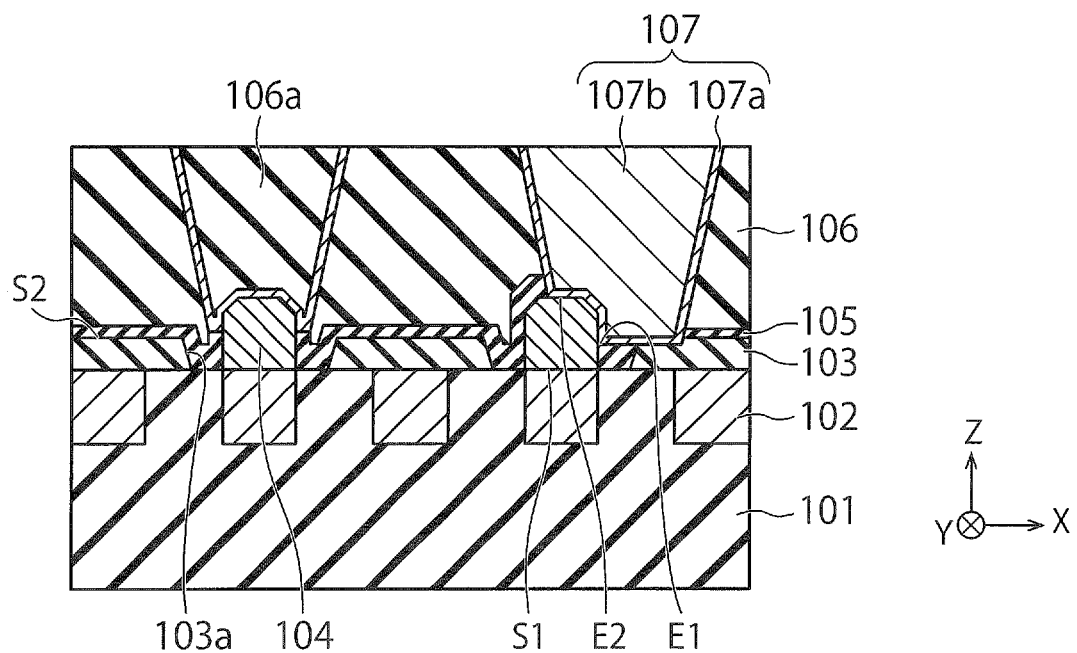

Next, the barrier metal layer 107a and the plug material layer 107b are formed in order in the opening 106a (FIG. 8B). As a result, the via plug 107 is formed on the metal interconnection 102 via the metal bump 104. Thereafter, the base layer 112 is removed, and the resistor 113 is also removed if the resistor 113 remains.

FIG. 8B illustrates the state in which the via plug 107 on the right side is formed with a positional deviation. Even if such a positional deviation occurs, the distance between the via plug 107 and the metal interconnection 102 is long, as described above. Therefore, a short between the via plug 107 and the metal interconnection 102 and aging deterioration of the stopper insulator 103 can be inhibited. Accordingly, the positioning accuracy of lithography in the step of FIG. 7B may be low. For this reason, the lithography cost can be reduced. For example, ArF lithography or KrF lithography may be used in the step of FIG. 7B.

Thereafter, the metal interconnection 108, the third inter layer dielectric 109, the first insulating layer 61, and the first metal pad 62, etc. are formed so that the array chip 1 is manufactured. Moreover, the method illustrated in FIG. 3 is performed so that the semiconductor device of the present embodiment is manufactured.

In the aforementioned manner, the via plug 107 is formed above the metal interconnection 102 via the metal bump 104 in the present embodiment. Consequently, according to the present embodiment, the via plug 107 can be suitably formed above the metal interconnection 102 since a short between the via plug 107 and the metal interconnection 102 and aging deterioration of the stopper insulator 103 can be inhibited.

The via plug 107 of the present embodiment can be formed by various methods. For example, the via plug 107 may be formed by single damascene, or may be formed by dual damascene. Alternatively, like the metal bump 104, the via plug 107 may be formed by plating. In addition, in the present embodiment, a surface of the spacer insulator 105 and a surface of the metal bump 104 may be polished by CMP (Chemical Mechanical Polishing) at a timing between the step of FIG. 6B and the step of FIG. 6C. In this case, it is desirable that CMP is performed until the upper face of the stopper insulator 103 is exposed.

Second Embodiment

Figure 9A:
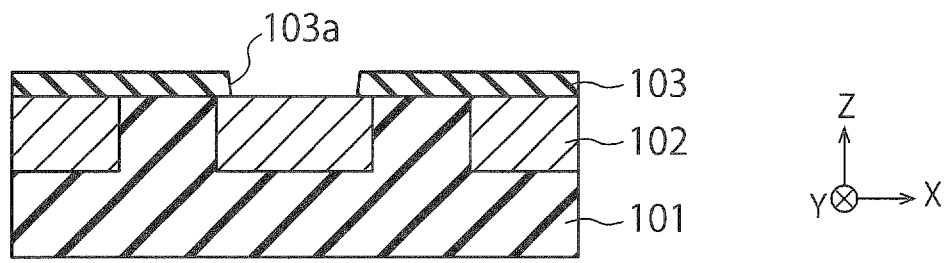
FIGS. 9A to 9C are cross-sectional views and a plan view for explaining the structure of a semiconductor device of a second embodiment.
Figure 9B:
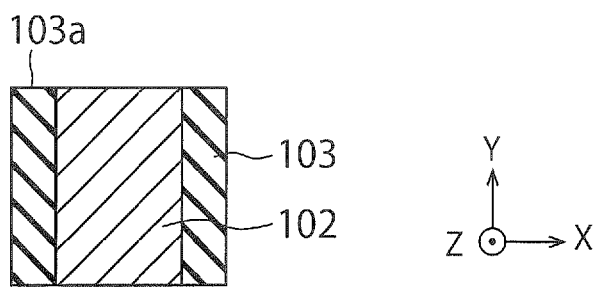
Figure 9C:
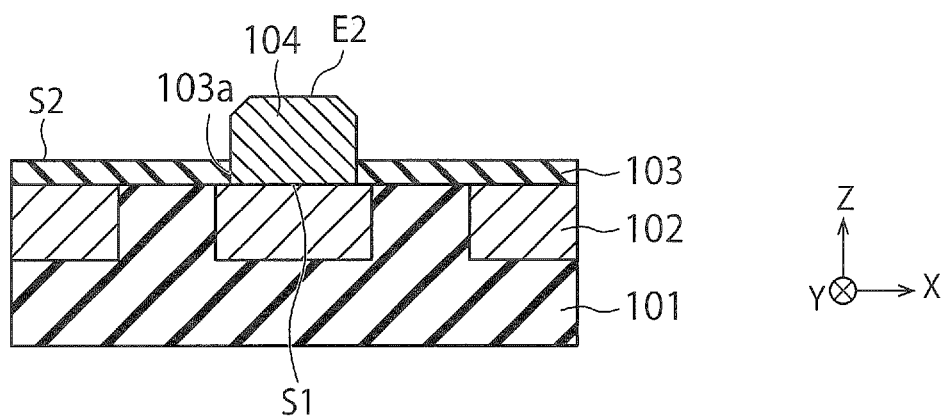

FIGS. 9A to 9C are cross-sectional views and a plan view for explaining the structure of a semiconductor device of a second embodiment.

FIGS. 9A and 9B are a cross-sectional view and a plan view of the step of FIG. 5C, respectively. Like FIG. 6A, FIG. 9C is a cross-sectional view showing the metal bump 104 formed on the first metal interconnection 102.

Figure 10A:
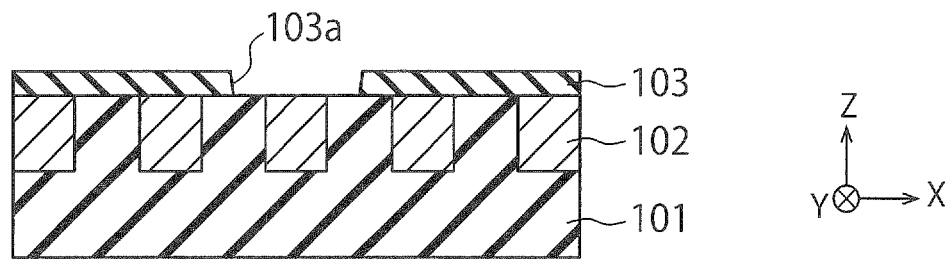
FIGS. 10A to 10C are cross-sectional views and a plan view for explaining the structure of the semiconductor device of the second embodiment.
Figure 10B:
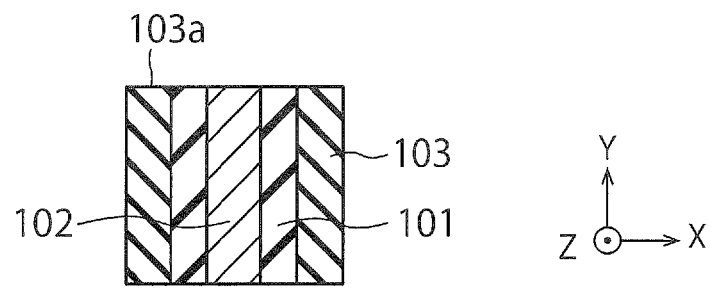
Figure 10C:
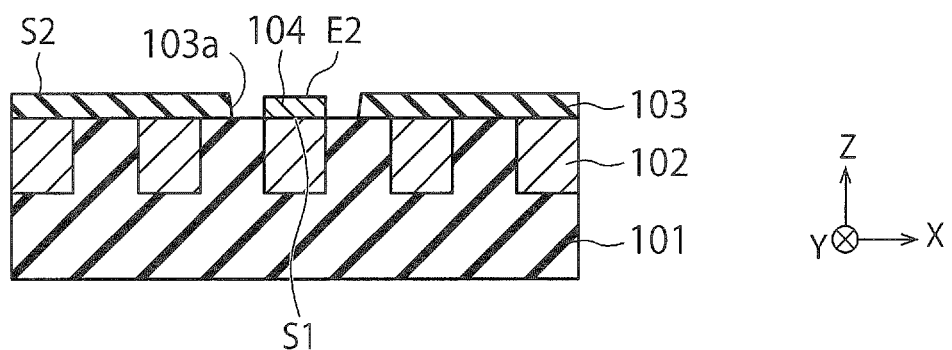

FIGS. 10A to 10C are cross-sectional views and a plan view for explaining the structure of the semiconductor device of the second embodiment.

FIGS. 10A to 10C correspond to FIGS. 9A to 9C, respectively. However, the metal bump 104 in FIG. 9C is formed on the first metal interconnection 102 that is thick, and the metal bump 104 in FIG. 10C is formed on the first metal interconnection 102 that is thin.

As described above, the metal bump 104 can be formed on the first metal interconnection 102 that is thin by the method of the first embodiment. However, when the metal bump 104 is formed on the first metal interconnection 102 that is thin, a disadvantage such as reduction in the growing speed of the metal bump 104 is brought about. Therefore, in the present embodiment, an explanation is given of a method for enabling formation of the metal bump 104 on the first metal interconnection 102 that is thick while enjoying the benefits of the first embodiment.

Figure 11:
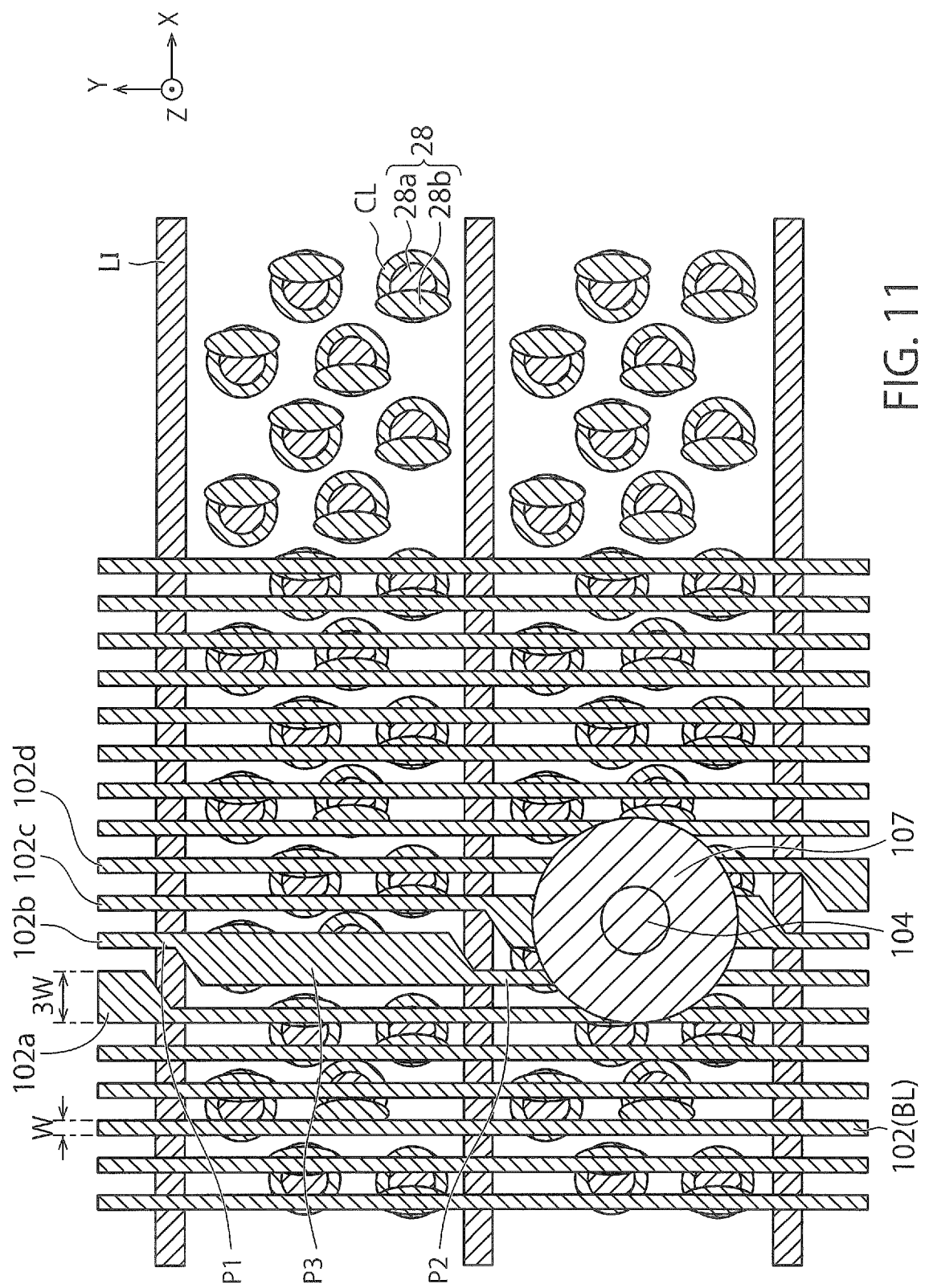
FIG. 11 is a plan view showing the structure of the semiconductor device of the second embodiment.

FIG. 11 is a plan view showing the structure of the semiconductor device of the second embodiment.

The semiconductor device of the present embodiment includes a plurality of interconnections L1 extending in the X direction, a plurality of the columnar portion CL, and a plurality of the plugs 28. The plugs 28 each include a contact plug 28a and a via plug 28b that is disposed on the contact plug 28a. One columnar portion CL, one contact plug 28a disposed on the one columnar portion CL, and one via plug 28b disposed on the one contact plug 28a constitute one columnar structure. The semiconductor device of the present embodiment includes a plurality of the columnar structures each having this shape.

Like FIG. 4, FIG. 11 further illustrates a plurality of the metal interconnections 102 including metal interconnections 102a to 102d, the metal bump 104 that is disposed on the metal interconnection 102c, and the via plug 107 that is disposed on the metal bump 104. The metal interconnections 102 extend in the Y direction, and are disposed on the via plugs 28b.

The metal interconnections 102 of the present embodiment each include a first portion P1 and a second portion P2 each having a first width (W) and a third portion P3 that is disposed between the first portion P1 and the second portion P2 and having a second width (3W) larger than the first width. In the present embodiment, the third portion P3 is used for disposition of the metal bump 104. FIG. 11 illustrates the metal bump 104 that is disposed on the third portion P3 of the metal interconnection 102c. The second width is set to be three times larger than the first width in the present embodiment, but may be set to be any other value.

In the present embodiment, a majority part of each of the metal interconnections 102 has the first width, and a minority part of each of the metal interconnections 102 has the second width. However, since the metal bump 104 is formed on the second-width part, the growing speed of the metal bump 104 is high. Therefore, according to the present embodiment, the growing speed of the metal bump 104 can be made high while the integration is increased with use of the metal interconnections 102 that are thin.

Hereinafter, regarding the details of the shape of each of the metal interconnections 102, the metal interconnection 102c is explained as an example.

In the metal interconnection 102c, the first portion P1 extends in the Y direction, and is connected, at the upper right corner of the third portion P3, to the third portion P3. In addition, the second portion P2 extends in the Y direction, and is connected, at the lower left corner of the third portion P3, to the third portion P3. Hereinafter, the upper right corner is referred to as a first point, and the lower left corner is referred to as a second point. In the metal interconnection 102c, the position of the first point P1 is deviated, in the X direction, from the position of the second point P2. Specifically, these positions are deviated from each other by the X coordinate of 2W.

In the +X direction from the metal interconnection 102c, the metal interconnection 102d is adjacent to the metal interconnection 102c. The position of the third portion P3 of the metal interconnection 102d is deviated, in the −Y direction, from the position of the third portion P3 of the metal interconnection 102c. In the −X direction from the metal interconnection 102c, the metal interconnection 102b is adjacent to the metal interconnection 102c. The position of the third portion P3 of the metal interconnection 102b is deviated, in the +Y direction, from the position of the third portion P3 of the metal interconnection 102c. The ±Y direction is an example of a first direction, and the ±X direction is an example of the second direction.

This arrangement has an advantage that a region occupied by the metal interconnections 102 can be reduced while the metal interconnections 102 include the respective third portions P3, for example. In a case where a certain columnar portion CL in the memory cell array 11 is selected when writing or the like is executed, this selection needs to be made by selection of one bit line BL and one selection gate SG. This bit line BL and this selection gate SG need to be electrically connected to only one columnar portion CL. For this reason, not only a columnar structure including the columnar portion CL, the contact plug 28a, and the via plug 28b but also a structure that is obtained by eliminating the contact plug 28a and/or the via plug 28b from the columnar structure is provided under the third portion P3 in FIG. 11. The columnar portion CL in this structure is a dummy columnar portion that is not electrically activated. Alternatively, a structure obtained by eliminating at least the columnar portion CL from the columnar structure may be provided under the third portion P3 in FIG. 11.

Figure 12:
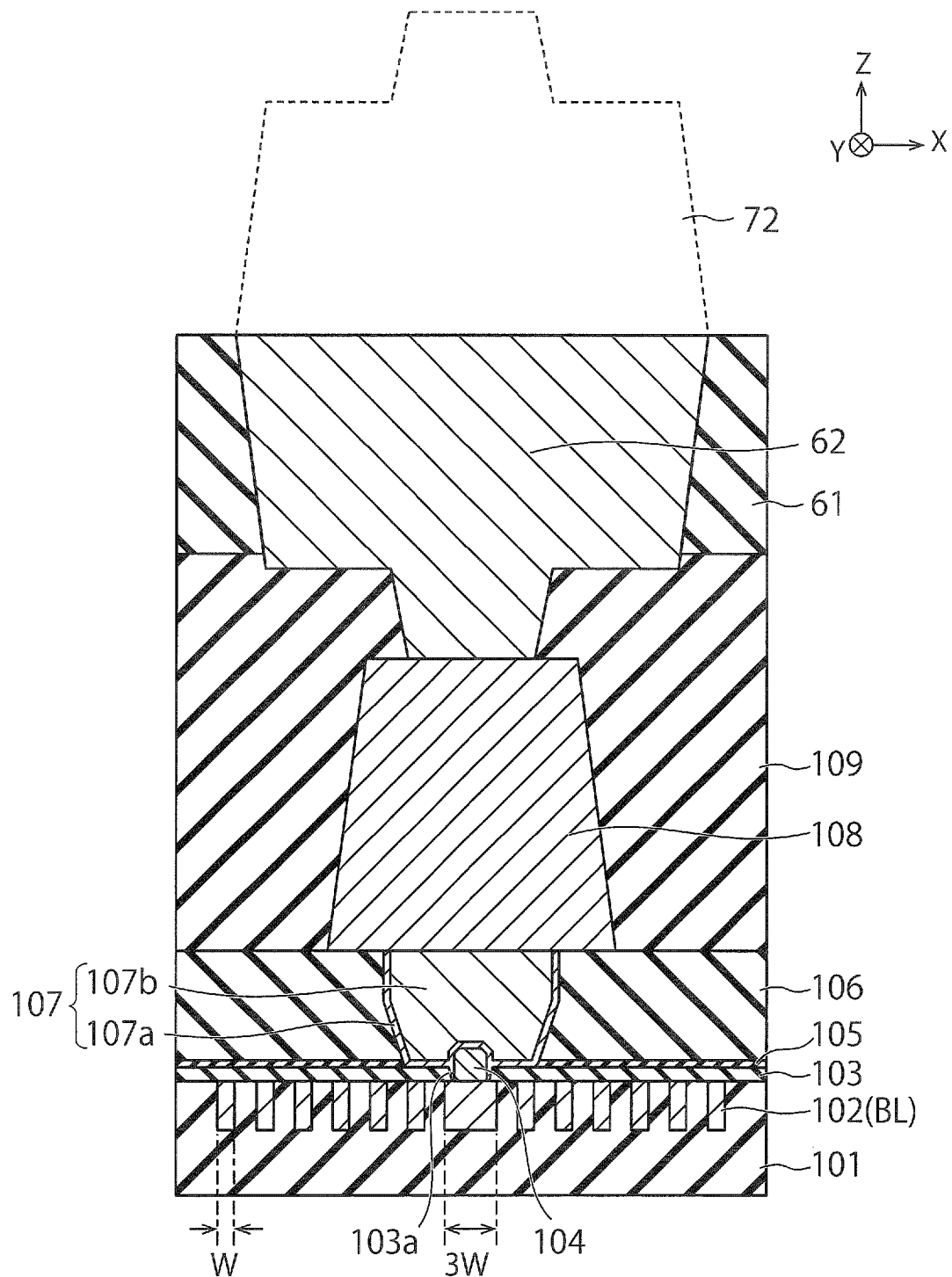
FIG. 12 is a cross-sectional view showing the structure of the semiconductor device of the second embodiment.

FIG. 12 is a cross-sectional view showing the structure of the semiconductor device of the second embodiment.

FIG. 12 illustrates a cross section similar to that in FIG. 4. It is to be noted that the width of the first metal interconnection 102 under the metal bump 104 is 3W. This illustrates a cross section of the third portion P3 of the first metal interconnection 102.

Figure 13:
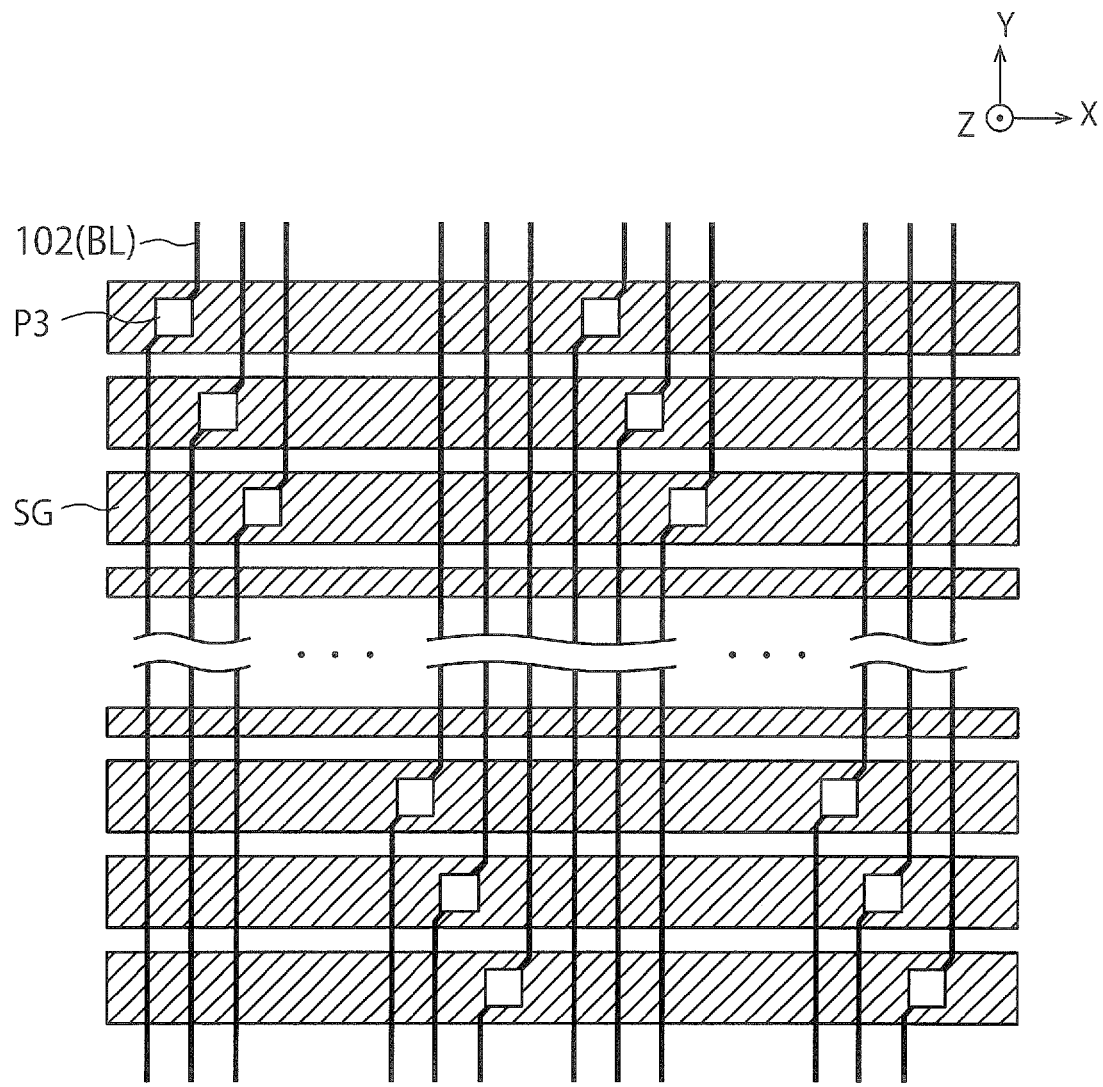
FIG. 13 is a plan view schematically showing the structure of the semiconductor device of the second embodiment.

FIG. 13 is a plan view schematically showing the structure of the semiconductor device of the second embodiment.

FIG. 13 illustrates the selection gates SG. These selection gates SG each extend in the X direction, and are adjacent to each other in the Y direction. In FIG. 13, the third portion P3 of each of the metal interconnections 102 (bit lines BL) is disposed on any one of the selection gates SG.

FIGS. 14A to 15B are planar views showing the method of manufacturing the semiconductor device of the second embodiment. Hereinafter, an explanation is given of a method for forming the metal interconnections 102 each including the first to third portions P1 to P3.

Figure 14A:
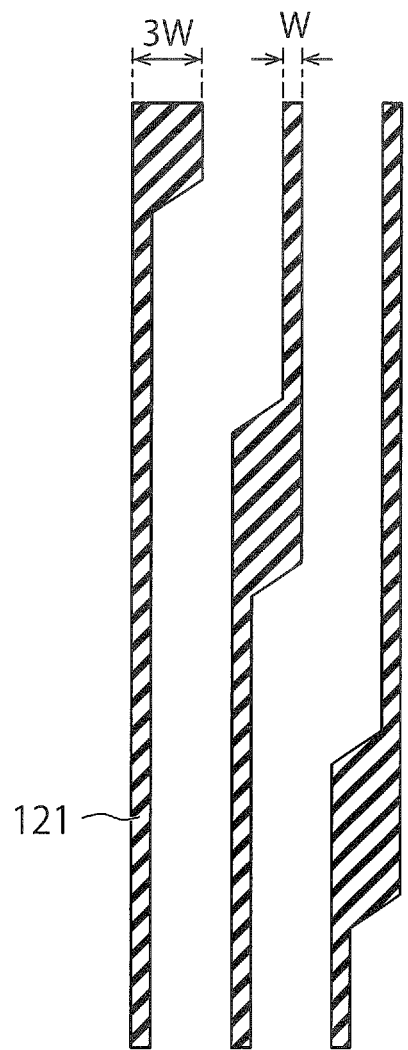

First, a plurality of first core material interconnections 121 extending in the Y direction are formed on the first inter layer dielectric 101 (FIG. 14A). The first core material interconnections 121 each include a portion having the first width (W) and a portion having the second width (3W). The first core material interconnections 121 are formed by lithography or slimming, for example.

Figure 14B:
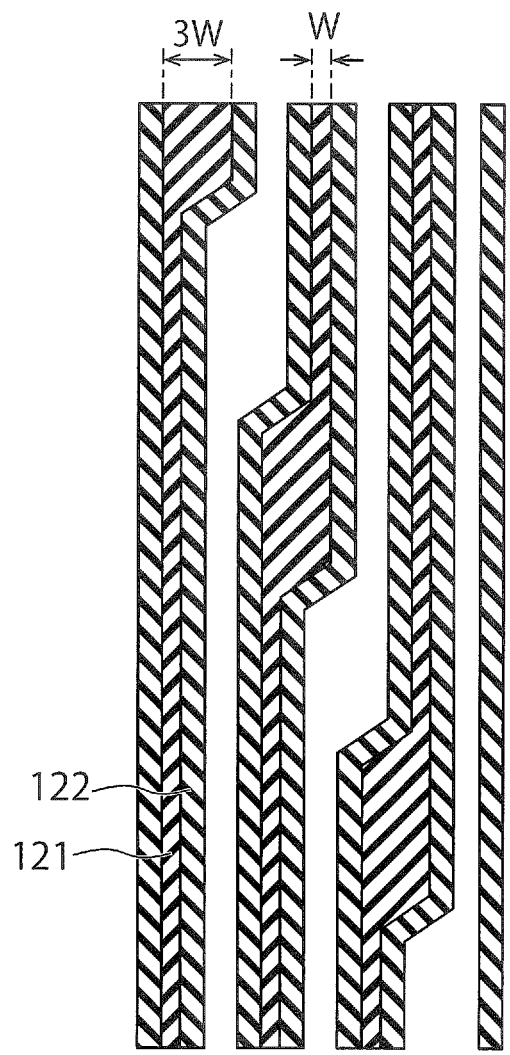

Next, a plurality of second core material interconnections 122 extending in the Y direction are formed on side faces of the first core material interconnections 121 (FIG. 14B). The second core material interconnections 122 each have a shape including a bent portion near the second-width portion of the corresponding first core material interconnection 121.

Next, the first core material interconnections 121 are removed (FIG. 15A). Next, a plurality of the metal interconnections 102 are formed in gaps between the second core material interconnections 122 by damascene (FIG. 15B). As a result, the metal interconnections 102 are each formed into a shape including the first to third portions P1 to P3. In the present embodiment, the second core material interconnections 122 are used as a part of the first inter layer dielectric 101.

As explained so far, the metal interconnections 102 of the present embodiment each include a portion having the first width and a portion having the second width that is larger than the first width, and the metal bump 104 is formed on the portion having the second width. Consequently, according to the present embodiment, the metal bump 104 can be formed on the metal interconnection 102 that is thick while the benefits of the first embodiment are enjoyed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A semiconductor device comprising:
  a first chip including:
    a memory cell array;
    a first insulator;
    a plurality of interconnections provided in the first insulator and above the memory cell array, respectively extending in a first direction, and arranged in a second direction crossing the first direction;
    a second insulator provided on and above the first insulator and the plurality of interconnections;
    a conductor provided on and above a first interconnection among the plurality of interconnections and having a shape that is projected upwardly with respect to the first interconnection in the second insulator; and
    a plug provided on the first interconnection via the conductor;

a second chip bonded to the first chip, and including a substrate and a transistor provided on the substrate; and a metal pad provided above the plug, electrically connected to the plug, and provided on a bonding surface of the first chip and the second chip, the metal pad electrically connecting the transistor to the memory cell array.

2. The device of claim 1, wherein a lower end of a contact face between the conductor and the plug is provided at a position higher than an upper face of the first interconnection.

3. The device of claim 1, wherein a lower end of a contact face between the conductor and the plug is provided at a position lower than an upper end of the conductor.

4. The device of claim 3, wherein an upper face of the plug has an area larger than an area of a lower face of the conductor.

5. The device of claim 3, wherein the plurality of interconnections each includes a portion having a first width and a portion having a second width that is larger than the first width, and the conductor is provided on the portion having the second width.

6. The device of claim 3, wherein the plurality of interconnections each includes first and second portions each having a first width, and a third portion provided between the first portion and the second portion and having a second width that is larger than the first width, and the conductor is provided on the third portion of the first interconnection.

7. The device of claim 6, wherein the first portion extends in a first direction, and is connected to the third portion at a first point, the second portion extends in the first direction, and is connected to the third portion at a second point, and a position of the first point is deviated from a position of the second point in a second direction that is perpendicular to the first direction.

8. The device of claim 7, wherein the plurality of interconnections include a second interconnection that is adjacent with the first interconnection, the first interconnection includes the first and second portions each having the first width, and the third portion provided between the first portion and the second portion and having the second width that is larger than the first width, the second interconnection includes the first and second portions each having the first width, and the third portion provided between the first portion and the second portion and having the second width that is larger than the first width, and a position of the third portion of the second interconnection is deviated from a position of the third portion of the first interconnection in the first direction.

* * * * *